(12) United States Patent
Bucsa et al.

(10) Patent No.: US 9,134,354 B2
(45) Date of Patent: Sep. 15, 2015

(54) SYSTEM AND METHOD FOR GROUND FAULT DETECTION AND FAULT TYPE EVALUATION

(71) Applicant: Tyco Safety Products Canada Ltd., Concord (CA)

(72) Inventors: Andrei Bucsa, Toronto (CA); Stephen D. W. Fosty, Brampton (CA); Aurel Cojocaru, Mississauga (CA)

(73) Assignee: TYCO SAFETY PRODUCTS CANADA LTD., Concord, Ontario (CA)

( * ) Notice: Subject to any disclaimer, the term of this patent is extended or adjusted under 35 U.S.C. 154(b) by 218 days.

(21) Appl. No.: 13/648,242

(22) Filed: Oct. 9, 2012

(65) Prior Publication Data

US 2013/0154660 A1    Jun. 20, 2013

Related U.S. Application Data

(60) Provisional application No. 61/577,303, filed on Dec. 19, 2011.

(51) Int. Cl.

| | |
|---|---|
| G01R 31/14 | (2006.01) |
| G01R 31/28 | (2006.01) |
| G01R 23/02 | (2006.01) |
| H02J 7/00 | (2006.01) |
| G01R 19/00 | (2006.01) |
| G06F 17/00 | (2006.01) |
| H02H 3/087 | (2006.01) |
| H02H 3/06 | (2006.01) |

(52) U.S. Cl.
CPC ............. *G01R 23/02* (2013.01); *G01R 19/00* (2013.01); *G06F 17/00* (2013.01); *H02H 3/087* (2013.01); *H02J 7/0068* (2013.01); *H02H 3/06* (2013.01)

(58) Field of Classification Search
CPC ........... H02H 9/08; H02H 3/32; H02H 3/087; H02H 3/06; G01R 31/28; G01R 23/02; G01R 19/00; H02J 7/0068; G06F 17/00
USPC ......... 324/500, 509–510, 512, 522, 528–530; 361/41–42, 45; 702/57–59
See application file for complete search history.

(56) References Cited

U.S. PATENT DOCUMENTS

| | | | | |
|---|---|---|---|---|
| 3,836,821 | A | * | 9/1974 | Wahlgren et al. ............... 361/45 |
| 3,848,159 | A | * | 11/1974 | Nye et al. ...................... 361/45 |
| 4,037,155 | A | * | 7/1977 | Ahmed ........................ 324/133 |
| 4,114,089 | A | * | 9/1978 | Ahmed ........................ 324/509 |

(Continued)

*Primary Examiner* — Melissa Koval
*Assistant Examiner* — Felicia Farrow
(74) *Attorney, Agent, or Firm* — Kacvinsky Daisak Bluni PLLC (57) ABSTRACT

The embodiments disclose a circuit for detecting and determining a type of ground fault in a security system. An operational amplifier (OA) having positive and negative inputs and an output may receive AC input signals having different frequencies, $f_1$ and $f_2$ at a positive input and provide an AC output signal at the output. An OA feedback loop may comprise a ground fault equivalent impedance connected at the OA negative input and a feedback resistor connected between the OA output and the OA negative input. A rectifier may convert the AC output signal to a DC signal and a filter to obtain a steady DC voltage from the rectified DC signal. A steady DC voltage for two different AC input signals may be obtained and converted to a relative voltage with respect to a constant input voltage amplitude. The relative voltages may be compared to detect and determine a type of ground fault condition.

17 Claims, 5 Drawing Sheets

(56) References Cited

U.S. PATENT DOCUMENTS

| | | | | |
|---|---|---|---|---|
| 4,430,683 A | * | 2/1984 | Kawai et al. | 361/42 |
| 5,402,071 A | * | 3/1995 | Bastard et al. | 324/509 |
| 5,990,686 A | * | 11/1999 | Vokey et al. | 324/523 |
| 6,392,422 B1 | * | 5/2002 | Kammer et al. | 324/650 |
| 6,421,618 B1 | * | 7/2002 | Kliman et al. | 702/58 |
| 6,856,137 B2 | * | 2/2005 | Roden et al. | 324/509 |
| 6,922,643 B2 | * | 7/2005 | Takakamo et al. | 702/58 |
| 7,180,300 B2 | * | 2/2007 | Premerlani et al. | 324/512 |
| 7,292,042 B2 | * | 11/2007 | Morita et al. | 324/509 |
| 7,529,069 B1 | * | 5/2009 | Weems et al. | 361/42 |
| 7,636,224 B2 | * | 12/2009 | Zandonella Balco | 361/42 |
| 8,085,517 B2 | * | 12/2011 | Weems et al. | 361/42 |
| 2004/0184207 A1 | * | 9/2004 | DiSalvo et al. | 361/42 |
| 2011/0068802 A1 | * | 3/2011 | Roscoe et al. | 324/509 |
| 2012/0249154 A1 | * | 10/2012 | Dao et al. | 324/509 |

* cited by examiner

SYSTEM AND METHOD FOR GROUND FAULT DETECTION AND FAULT TYPE EVALUATION

BACKGROUND OF THE INVENTION

1. Field of the Invention

Embodiments of the present disclosure relate to security alarm systems and associated methods for protecting residences, businesses and other premises. More particularly, the present disclosure relates to ground fault detection within the circuitry of a security alarm system and identifying the type of ground fault condition once detected.

2. Discussion of Related Art

Security or alarm systems are installed in premises to detect hazardous or potentially hazardous conditions. A security system generally includes a plurality of detectors/sensors, one or more keypads and a control panel which contains much of the system electronics. The control panel may include a communication interface for remote monitoring and two-way communication over telephone or wireless communication paths with a remote monitoring station. Each of the detectors may communicate with the control panel to provide its current status as well as notification of an alarm condition. Examples of possible alarm conditions may include unauthorized entry or the unexpected presence of a person who may be an intruder, fire, smoke, toxic gas, high/low temperature conditions (e.g., freezing), flooding, power failure, etc. In other words, an alarm condition may represent a detectable condition that might lead to personal hazard or property damage. Audible and/or visible alarm notification devices such as sirens, lights, etc., may also be utilized to notify occupants of the existence of an alarm condition. The control panel may be located in a utility room, basement, etc., and may communicate with the detectors and notification devices over wired or wireless signal paths. A keypad, which may also communicate with the control panel over a wired or wireless connection, may be used to arm/disarm the system as well as providing a means to display various system messages via a status display screen.

Maintaining the integrity of electrical connections between and among the various detectors/sensors, notification devices, keypads and control panel is of great importance to ensure that these devices are functioning properly. Ground fault conditions may present a breakdown in system integrity. A ground fault condition is generated when a minimum leakage current is flowing to earth ground; in particular if any wire connected to the alarm system is shorted or heavily coupled to earth ground. In the case of an alarm system, if any wire connected to the alarm system should touch or create a leakage to earth-ground, a ground fault should be indicated. Thus, it is desirable to detect, identify and notify of a ground fault condition in the control panel that may compromise the integrity of a system. If left unaddressed, ground fault conditions may render the security system inoperable.

One type of ground fault condition is a non-isolated panel connection to earth ground. A non-isolated panel connection may include certain of the wired control panel connections to other system components such as, for example, the detectors, keypads and notification devices. One common approach to detecting such a ground fault condition involves injecting a steady DC current to earth ground and measuring the voltage drop between earth ground and circuit ground. The voltage drop is proportional to the ratio of earth ground to circuit ground resistance. This may typically involve a current generator to supply the DC current that may be coupled to the higher voltage of the circuit to drive the ground resistance. The voltage drop between earth ground and circuit ground is then evaluated to detect whether a ground fault has occurred. For example, a detected resistance that is smaller than a specific expected value may indicate an unspecified ground fault condition in the system. The above solution, however, is not immune to DC level shifting. Generally, DC level shifting may occur when interfacing different types of circuits to each other, such as when interfacing circuits operating at one particular voltage level to circuits operating at another voltage level. The above solution cannot categorize, identify, or distinguish between a capacitive coupling induced ground fault condition and a resistance induced ground fault condition. In addition, a capacitive coupling type of ground fault condition may increase the probability of a control panel malfunction due to possible component coupling to a noise source. It is with respect to these and other considerations that the present improvements have been needed.

SUMMARY

In view of the foregoing, a ground fault detection and notification system is needed that can reliably identify the type of a detected ground fault condition. Accordingly, exemplary embodiments of the present disclosure are directed to a process of detecting and identifying ground fault conditions for security systems.

In an exemplary embodiment, a circuit for detecting and determining a type of ground fault in a security system is disclosed. An AC function generator may generate at least two separate AC input signals of different frequencies, $f_1$ and $f_2$. An operational amplifier (OA) having positive and negative inputs and an output may receive the AC input signals at the positive input and provide an AC output signal at the output. An OA feedback loop may comprise a ground path impedance coupled between the OA output and the OA negative input. The AC output signal may be coupled with the ground path impedance and applied to the OA negative input. A rectifier may convert the AC output signal to a DC signal and a filter to obtain a steady DC voltage from the rectified AC signal.

In another exemplary embodiment, a method of determining a type of ground fault is disclosed. A first AC input signal having a first frequency ($f_1$) may be applied to a positive input of an operational amplifier (OA). A feedback signal derived from a first AC output signal of the OA coupled to a ground path impedance may be applied to a negative input of the OA. The first AC output signal may be rectified to convert the first AC output signal to a first DC signal and then filtered to obtain a first steady DC voltage. A second AC input signal having a second frequency ($f_2$) may be applied to the positive input of the operational amplifier (OA). A feedback signal derived from a second AC output signal of the OA coupled to a ground path impedance may be applied to the negative input of the OA. The second AC output signal may be rectified to convert the second AC output signal to a second DC signal and then filtered to obtain a second steady DC voltage. The ratio of the second steady DC voltage to the first steady DC voltage may be determined and used to characterize a type of ground fault.

DESCRIPTION OF EMBODIMENTS

The present disclosure will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 1:
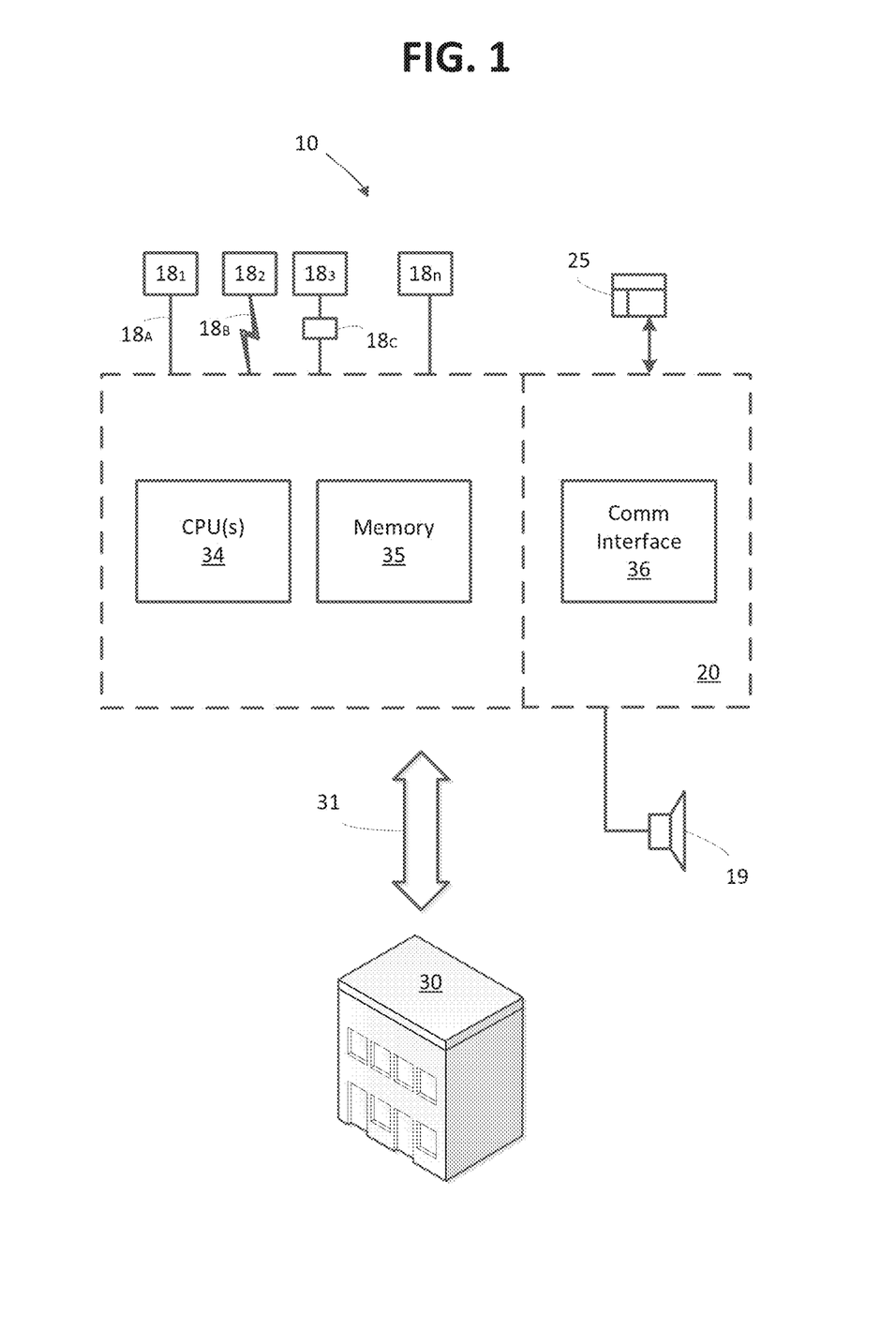
FIG. 1 illustrates a block diagram of an exemplary security system in accordance with an embodiment of the present disclosure.

FIG. 1 is a block diagram of a typical security system 10 capable of implementing the embodiments of the present disclosure. The security system 10 may be installed in a building or premises. Security system 10 includes a control panel 20 which generally controls operation of the system. A number of detection devices $18_1 \ldots 18_n$ are utilized to monitor an area. Detection devices may include, for example, motion detectors, door contacts, glass break detectors, smoke detectors, water leakage detectors, etc. Detection devices $18_1 \ldots 18_n$ communicate with panel 20 by a wired interconnect 18A, wirelessly 18B, through the electric wiring of the premises 18C, or otherwise. One or more user interfaces, such as keypad 25 is used to communicate with control panel 20 to arm, disarm, notify and generally control system 10. The security system 10 may further include other notification devices such as sirens, emergency lights, etc., referenced generally as 19.

Control panel 20 communicates with each of the detection devices $18_1 \ldots 18_n$, keypad 25 and notification devices 19 as well as communicating with a monitoring facility 30 which is typically geographically remote from the premises in which system 10 is installed. Control panel 20 may include a CPU 34, memory 35 and communicator 36. CPU 34 functions as a controller to control the various communication protocols within system 10. Memory 35 stores system parameters, detection device information, address information etc. Communicator 36 sends and receives signals to/from the monitoring facility 30 via communications link 31. Alternatively, communicator 36 may be a separate device that communicates with controller 20 via a hardwired or wireless connection.

When an alarm condition occurs based on the operation of one or more detection devices $18_1 \ldots 18_n$, a signal is transmitted from the respective detection device to control panel 20. Depending on the type of signal received from the one or more detection devices, communicator 36 communicates with monitoring facility 30 via link 31 to notify the monitoring facility that an alarm notification has occurred at the premises. Communication link 31 may be a POTS (Plain Old Telephone System), a broadband connection (e.g., internet), a cellular link such as GSM (Global System for Mobile communications) transmission, a voice-over-IP (VoIP) connection, etc. In certain security systems, keypad 25, control panel 20 and communicator 36 may be housed within a single unit.

As noted above, keypad 25 is used to communicate with control panel 20 to arm, disarm, notify and generally control system 10. Keypad 25 includes a status display which may include either individual indicators, such as discrete light emitting diodes or may include an LCD or LED display, capable of displaying messages regarding the status of particular detection devices $18_1 \ldots 18_n$ and/or operation of the system.

Each security system is given at least one unique access code (sometimes referred to as a PIN), which is generally a sequence of symbols (e.g. numbers, letters, characters, etc.) entered via keypad 25 used to arm and disarm system 10. When arming system 10, a user enters their access code and an exit delay time is provided before the detection devices $18_1 \ldots 18_n$ are activated so that a user may exit the premises before system 10 becomes armed. Conversely, upon entering the premises, the user enters the access code to disarm the system 10. An entry delay time period may be programmed into the system 10 to allow the user to enter the access code before the system goes into alarm mode.

Maintaining the integrity of electrical connections throughout the security system is of great importance to ensure that the detection devices $18_1 \ldots 18_n$, control panel 20, keypad 25 and notification device(s) 19 are all functioning properly. Ground fault conditions may indicate a breakdown in system integrity. As noted above, a ground fault condition is a type of short circuit that may exist when a hot wire touches or leaks to an earth ground wire or other earth grounded conductor. If left unaddressed, ground fault conditions may render the security system inoperable and/or create hazardous voltages to anyone touching the equipment.

Quickly and accurately determining the type of a ground fault may aid in troubleshooting and remedying the problem causing the ground fault condition. There are typically three types of ground fault conditions that may lead to undesirable leakage conditions in the control panel 20, those that are resistive in nature, those that are capacitive in nature, and those that stem from an AC fault. An AC fault, for instance, may result when one of the AC wires from an AC power source such as, for example, a main transformer within the control panel 20 is shorted to or closely coupled to earth ground. If the type of ground fault condition is identifiable, the source of the problem may be easier to pinpoint and fix by an electrical technician.

The embodiments described herein present an operational amplifier (OA) based circuit that may be implemented within the control panel 20. The circuit may assist in detecting and identifying multiple types of ground fault conditions. In general, the circuit makes use of the ground impedance of the panel as part of a feedback loop to measure the gain of the OA when driven by particular AC input signals. As further detailed below, OA gains (as converted to and measured in DC voltage levels) between particular OA input signals and the OA output signal may be compared to detect and determine a type of ground fault condition. The circuit may allow for impedance calculations that may indicate capacitive coupling ground fault conditions, resistive ground fault conditions, and AC faults or perturbances from earth ground. Once a ground fault condition has been detected and identified, remedial steps may be taken to correct the underlying problem that caused the ground fault condition.

Figure 2:
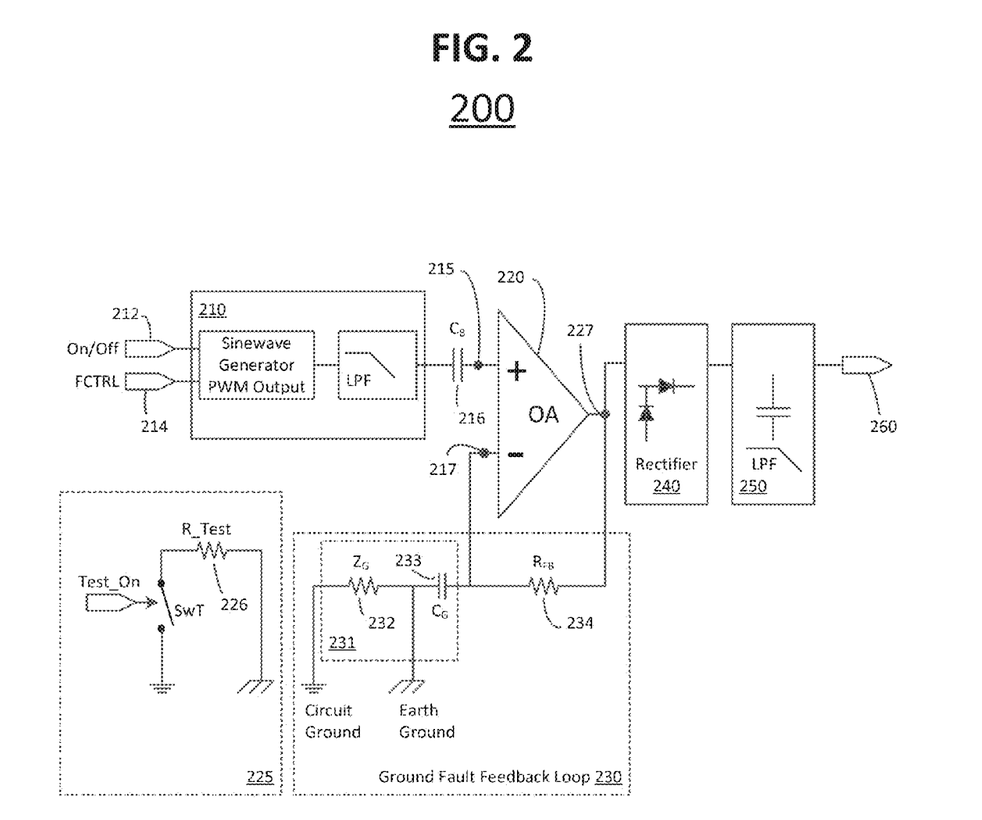
FIG. 2 illustrates a circuit of an exemplary ground fault detection system in accordance with an embodiment of the present disclosure.

FIG. 2 illustrates an exemplary ground fault detection circuit 200 in accordance with an embodiment of the present disclosure. The circuit 200 of FIG. 2 may be incorporated into a control panel 20 of a security system 10 to detect and identify undesirable ground fault conditions that may occur within the system 10. A ground fault condition may be indicative of a short or a close coupling of a connection to earth ground. Such a condition may undesirably disturb the functionality of the security system to the point of rendering the system inoperable.

The circuit 200 may include an AC function generator 210 to ensure good amplitude stability and control such as, for example, a direct digital synthesis (DDS) sine wave generator. An AC function generator is a generic signaling device adapted to generate a variety of test signals. For example, AC function generator 210 may generate sinusoidal waveforms of different frequencies as set by frequency control input FCTRL 214. For illustrative purposes, a first waveform may be generated having a frequency of $f_1$ while a second waveform may be generated having a frequency of $f_2$ in which $f_2$ is half of $f_1$. The first and second AC signals may be engineered to have the same amplitude. The AC function generator 210 may be disabled using On/Off input 212.

In operation, the first and second AC signals may be alternately applied to an operational amplifier (OA) 220 at input 215 in which the input voltage ($v_{in}$) for each of the first and second AC signals is the same (e.g., the same amplitude). A DC blocking capacitor ($C_B$) 216 ensures that no DC signals pass to the OA 220. A ground fault impedance path 232 may also be incorporated into a ground fault feedback loop 230 of the OA 220 that feeds the OA output signal at 227 back to the OA negative input to the OA 220 through a feedback resistor ($R_{FB}$) 234. Thus, the OA AC signal output amplitude at 227 will be correlated to the ground fault impedance ($Z_G$) 232. The ground fault feedback loop 230 may be modeled as an RC series circuit comprised of an impedance $Z_G$ 232 and capacitor $C_G$ 233 which forms a ground fault equivalent impedance 231 that is coupled in series with feedback resistor ($R_{FB}$) 234. For the frequency of generated reference voltages, the impedance of the capacitor $C_G$ is very low and can be considered $Z_G = Z_G + Z(C_G)$. Because $Z_G \gg Z(C_G)$, the OA 220 operates as a variable gain stage to generate an AC output signal at 227 having a voltage level ($v_{out}$) that may be determined according to $$v_{out} = v_{in}\left(1 + \frac{R_{FB}}{Z_G}\right).$$

In addition, $v_{rel} = v_{out} - v_{in} = v_{in}(R_{FB}/Z_G)$.

Since the output signal at 227 is an AC signal, it is supplied to a rectifier 240 to convert it to a DC signal. The rectifier 240 is an electrical device that converts alternating current (AC), which periodically reverses direction, to direct current (DC) which flows in only one direction. While rectification can deliver unidirectional current, it does not produce a steady voltage. In order to produce steady DC voltage level from a rectified AC signal, a filter 250 may be used. In its simplest form the filter 250 may be a capacitor placed at the DC output of the rectifier 240. Thus, after rectification and filtering, the AC output signal of OA 220 is converted to a steady DC voltage 260. This process is performed for each of the AC input signals ($f_1$ and $f_2$) generated by AC function generator 210 resulting in a steady DC voltage 260 for each of the AC input signals ($f_1$ and $f_2$).

If the ground impedance $Z_G$ 232 is infinite, the OA 220 will act as a repeater meaning that the OA output signal level at 227 ($v_{out}$) will be the same as the OA positive input signal at 215 ($v_{in}$). This will yield the minimum rectified result and is indicative of no ground fault condition. Any other ground impedance that is not infinite will create a gain at the output of the OA 220 at 227 when an AC input signal is applied at the positive input 215 of OA 220. Thus, a gain at the output of the OA 220 at 227 will yield a steady DC voltage at 260 and may be indicative of a ground fault condition.

If the steady DC voltages 260 (e.g., $v_{out1}$ and $v_{out2}$) are the same after rectification and filtering of the output signal at 227 for both AC input signals ($f_1$ and $f_2$), the fault may be characterized as resistive. If the steady DC voltages 260 ($v_{out1}$ and $v_{out2}$) are different after rectification and filtering of the output signal at 227 for both AC input signals ($f_1$ and $f_2$), the fault may be characterized as reactive (e.g., due to capacitive coupling).

For example, given a frequency characteristic of $f_2 = \frac{1}{2}f_1$, a $v_{rel}$ ratio (i.e., $v_{rel\_2}/v_{rel\_1}$) of 1:1 indicates a pure resistive ground fault condition and a ratio of 2:1 indicates a pure reactive ground fault condition. A $v_{rel}$ ratio between 1 and 2 indicates a degree to which the ground fault condition is reactive meaning there may be a capacitive coupling problem though not necessarily a total breakdown. If the AC function generator 210 is off and the output level ($v_{out}$) of OA 220 is high, the ground fault condition may be characterized as an AC coupling issue.

Returning to circuit 200 of FIG. 2, the earth ground connection may be AC coupled such that any DC level shifting (e.g., a change in the DC voltage level) that may result from I/0 biasing between circuit ground and earth ground will not affect the ground fault condition evaluation process. Biasing in electronics refers to the establishing of predetermined voltages or currents at various points of an electronic circuit to set an appropriate operating point. Thus, circuit 200 has been designed to be immune from any such DC level shifting effects because of the AC coupled earth ground connection through $C_G$ 233.

The circuit 200 may further include a test loop 225 adapted to perform device integrity checking and resistive fault calibration. For instance, the resistor (R_TEST) 226 may be substituted for the ground fault impedance path $Z_G$ 232. Since the resistor (R_TEST) 226 is a known value, the results for each of the AC input signals generated by AC function generator 210 can be calculated ahead of time and then compared to the actual results to calibrate the circuit based on the expected results.

The measurement cycle used to obtain the steady DC voltages 260 ($v_{out1}$ and $v_{out2}$) for the AC input signals characterized by f1 and $f_2$ is repetitive according to the following process. The circuit 200 is initially set such that the AC function generator 210 is off and the test loop 225 is off. The output ($v_{out}$) of the OA 220 at 227 is recorded. Next, the AC function generator 210 is switched on via On/Off input 212. The frequency control (FCTRL) 214 is set for frequency $f_1$ and a first sine wave of frequency $f_1$ is generated and applied to the positive input of OA 220 at 215. The circuit 200 will rectify the OA 220 output at 227 using rectifier 240 then filter the rectified output using filter 250 to yield a first measurement ($v_{out1}$) at 260 that is recorded and $v_{rel\_1}$ (as $v_{out1} - v_{in}$) is evaluated. The frequency control (FCTRL) 214 is then set for frequency $f_2$ in which $f_2$ is ½ of $f_1$, for example, and a second sine wave of frequency $f_2$ is generated and applied to the positive input of OA 220 at 215. The circuit 200 will rectify the OA 220 output at 227 using rectifier 240 then filter the rectified output using filter 250 to yield a second measurement ($v_{out2}$) at 260 that is also recorded and $v_{rel\_2}$ (as $v_{out2} - v_{in}$) is evaluated. The AC function generator 210 is then switched off using On/Off input 212 concluding one measurement cycle. The process is repeated on a continual basis to monitor the overall security system 10 status with respect to ground fault conditions.

Figure 3:
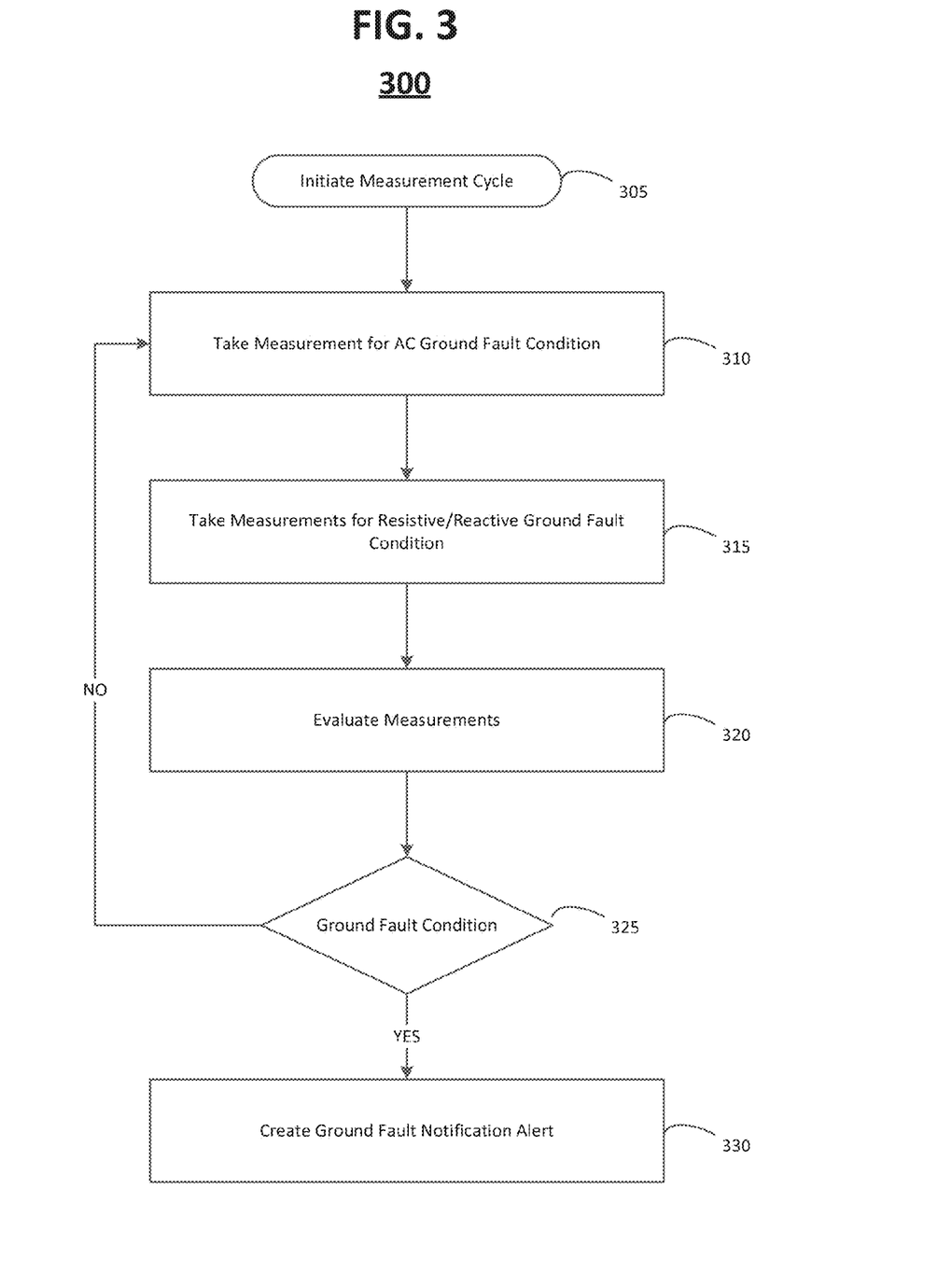
FIG. 3 illustrates a logic flow diagram of an exemplary ground fault detection method in accordance with an embodiment of the present disclosure.

FIG. 3 illustrates one embodiment of a logic flow 300 of an exemplary ground fault detection method in accordance with an embodiment of the present disclosure. The logic flow 300 may be representative of some or all of the operations executed by one or more embodiments described herein.

In the illustrated embodiment shown in FIG. 3, the logic flow 300 may initiate a measurement cycle at block 305. The logic flow 300 may take a measurement to determine an AC ground fault condition at block 310 as is described in more detail with reference to FIG. 4. The logic flow 300 may then take the measurements to determine a resistive or reactive ground fault condition at block 315 as is described in more detail in FIG. 5. The logic flow 300 may then evaluate the measurements to determine a type of ground fault condition at block 320 as is described in more detail in FIG. 6. The logic flow 300 may react to a ground fault condition at block 325 and create a ground fault condition notification alert at block 330.

For example, upon detection of a ground fault condition, the control panel 20 may create a notification alert. The notification alert may include one or more of an audible chime, a steady or blinking light, and a signal to a remote monitoring location. The audible chime may be sounded by a notification device 19 such as a speaker. The steady or blinking light may be displayed by a notification device 19 such as a light bulb or light emitting diode (LED) visible on the keypad 25 and/or the control panel 20. In addition, the notification alerts may be configured to indicate the type of ground fault condition. For example, the audible alert may sound differently depending on the type of ground fault condition that was detected. Thus, a speaker may emit sounds in a particular pattern to indicate the type of ground fault condition. An AC ground fault condition may be associated with a single intermittent chirp. A pure resistive ground fault condition may be associated with a double intermittent chirp. A reactive ground fault condition may be associated with a triple intermittent chirp. Similarly, a light may blink in a particular pattern to indicate the type of ground fault condition. The embodiments are not limited to these examples.

Figure 4:
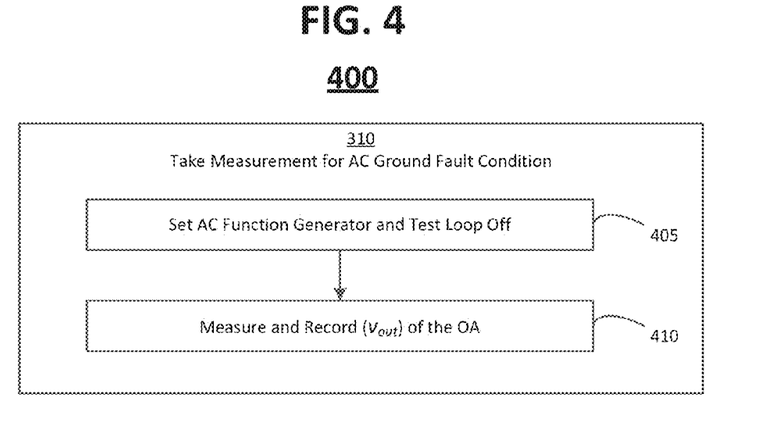
FIG. 4 illustrates one embodiment of a logic flow for taking the measurement to determine an AC ground fault condition in accordance with an embodiment of the present disclosure.

FIG. 4 illustrates one embodiment of a logic flow 400 for taking the measurement to determine an AC ground fault condition referenced in block 310 of FIG. 3 in accordance with an embodiment of the present disclosure. The logic flow 400 may be representative of some or all of the operations executed by one or more embodiments described herein.

In the illustrated embodiment shown in FIG. 4, the logic flow 400 the AC function generator 210 and test loop 225 are switched off at block 405. With the AC function generator 210 and test loop 225 switched off, the output of OA 220 is measured and recorded at operating point 227 of circuit 200 at block 410. The embodiments are not limited to this example.

Figure 5:
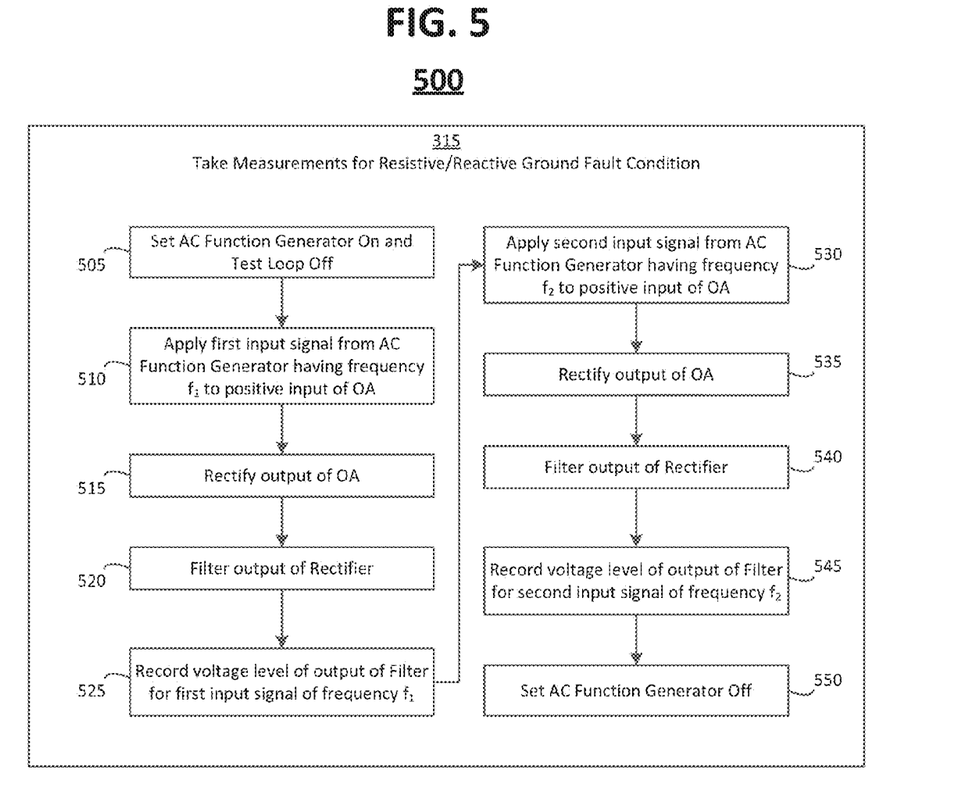
FIG. 5 illustrates one embodiment of a logic flow for taking the measurement to determine a resistive/reactive ground fault condition in accordance with an embodiment of the present disclosure.

FIG. 5 illustrates one embodiment of a logic flow 500 for taking a measurement to determine a resistive/reactive ground fault condition referenced in block 315 of the logic flow 300 shown in FIG. 3 in accordance with an embodiment of the present disclosure. The logic flow 500 may be representative of some or all of the operations executed by one or more embodiments described herein.

In the illustrated embodiment shown in FIG. 5, the logic flow 500 sets the AC function generator 210 to "On" and the test loop 225 to "Off" at block 505. The logic flow 500 may then apply a first input signal generated by AC function generator 210 to the positive input 215 of OA 220 at block 510. The first input signal generated by AC function generator 210 may be characterized by a frequency of $f_1$. The OA 220 will produce an output signal at 227. The output signal at 227 will be a function of the input signal at 215 and a negative input signal at 217. The negative input signal at 217 may be derived from a feedback loop comprising the output signal at 227 coupled with the ground fault impedance path 232. The ground fault equivalent impedance 231 may be modeled as an RC series circuit comprised of the impedance $Z_G$ 232 and capacitor $C_G$ 233. The ground fault feedback loop 230 may be modeled as the ground fault equivalent impedance 231 and the feedback resistor ($R_{FB}$) 234.

The logic flow 500 may then rectify the output of OA 220 at block 515. The output of OA 220 at 227 will be an AC signal. The AC signal output of OA 220 at 227 may be input to the rectifier 240 to convert it to a DC signal. The logic flow 500 may then filter the output of rectifier 240 by applying the output of rectifier 240 to the filter 250 at block 520. The output of rectifier 240 will be a DC signal but not one of steady voltage. The filter 250 may produce a steady DC voltage 260 for the first input signal generated by AC function generator 210. The steady DC voltage 260 for the first input signal may be referred to as $v_{out1}$. The same steps may then be performed for a second input signal generated by AC function generator 210.

The logic flow 500 may apply the second input signal generated by AC function generator 210 to the positive input 215 of OA 220 at block 530. The second input signal generated by AC function generator 210 may be characterized by a frequency of $f_2$ which may be, for example, ½ of $f_1$. The OA 220 will produce an output signal at 227. The output signal at 227 will be a function of the input signal at 215 and a negative input signal at 217. The negative input signal at 217 may be derived from a feedback loop comprising the output signal at 227 coupled with the ground fault impedance 232. The ground fault equivalent impedance 231 may be modeled as an RC series circuit comprised of the impedance $Z_G$ 232 and capacitor $C_G$ 233. The ground fault feedback loop 230 may be modeled as the ground fault equivalent impedance 231 and the feedback resistor ($R_{FB}$) 234.

The logic flow 500 may then rectify the output of OA 220 at block 535. The output of OA 220 at 227 will be an AC signal. The AC signal output of OA 220 at 227 may be input to the rectifier 240 to convert it to a DC signal. The logic flow 500 may then filter the output of rectifier 240 by applying the output of rectifier 240 to the filter 250 at block 520. The output of rectifier 240 will be a DC signal but not one of steady voltage. The filter 250 may produce a steady DC voltage 260 for the second input signal generated by AC function generator 210. The steady DC voltage 260 for the second input signal may be referred to as $v_{out2}$. The embodiments are not limited to this example.

Figure 6:
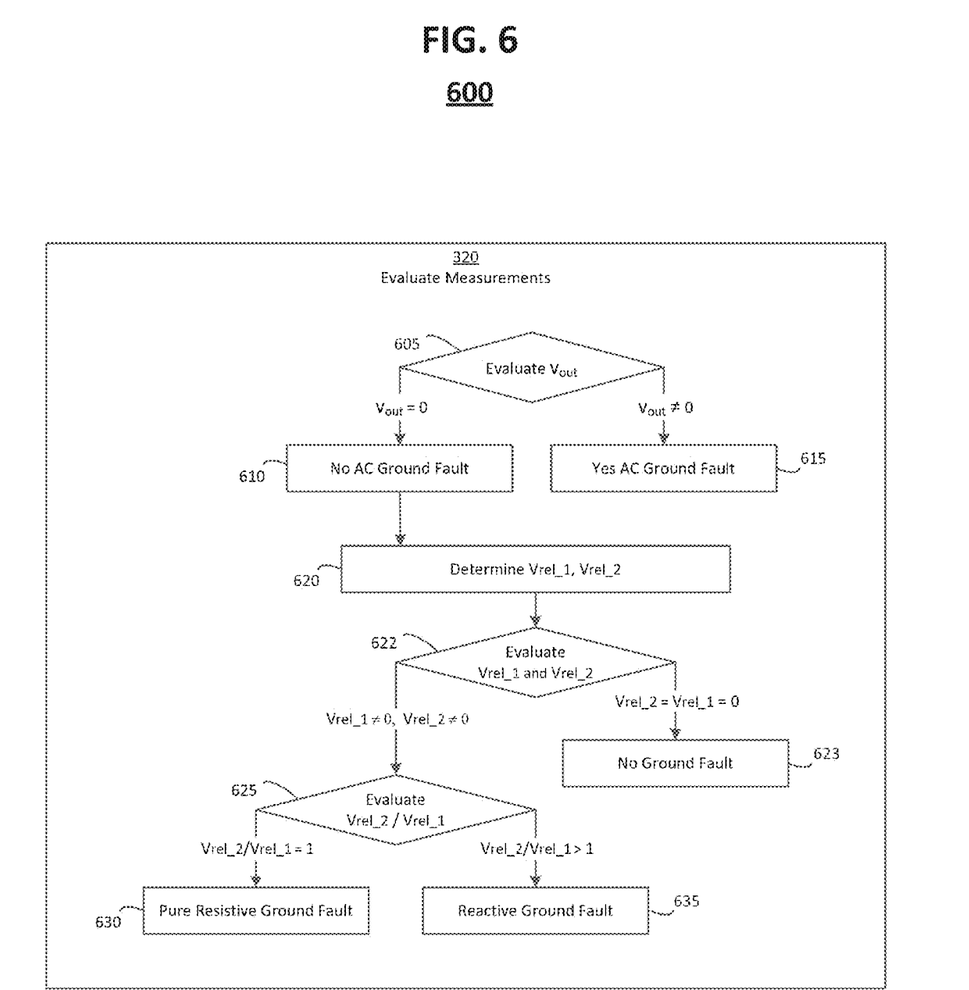
FIG. 6 illustrates one embodiment of a logic flow for evaluating the measurements in accordance with an embodiment of the present disclosure.

FIG. 6 illustrates one embodiment of a logic flow 600 for evaluating the measurements referenced in block 320 of logic flow 300 shown in FIG. 3 in accordance with an embodiment of the present disclosure. The logic flow 600 may be representative of some or all of the operations executed by one or more embodiments described herein.

In the illustrated embodiment shown in FIG. 6, the logic flow 600 may evaluate $v_{out}$ at block 605. $v_{out}$ may be indicative of the presence of an AC ground fault. If $v_{out}$ is equal to zero (0) volts when AC function generator (e.g., DDS) 210 is turned OFF, then no AC ground fault condition is determined at block 610. If, however, $v_{out}$ is not equal to zero (0) volts when AC function generator (e.g., DDS) 210 is turned OFF, then an AC ground fault condition is determined at block 615. This may cause the OA 220 to act as an inverted amplifier for any AC perturbation present at earth ground when the AC function generator (e.g., DDS) 210 is turned OFF.

Three (3) different states may be tested to evaluate whether there is an AC ground fault. The first test is for an AC fault as just described in blocks 605-615. If there is no AC fault as determined at block 610, the AC function generator (e.g., DDS) 210 may be turned ON to evaluate whether there may be other types of ground faults. The AC function generator (e.g., DDS) 210 may utilize two (2) different input frequencies to evaluate whether there may be other types of ground faults. In this example, the ratio of the input frequencies is 2:1. Other frequency ratios for $f_1$ and $f_2$ may be implemented such that a ground fault type may be determined based on a chosen ratio (e.g., n:1).

The logic flow 600 may determine $v_{rel\_1}$ and $v_{rel\_2}$ for respective input frequencies $f_1$ and $f_2$ when the AC function generator (e.g., DDS) 210 is ON at block 620. For example, $v_{rel\_1}=v_{out1}-v_{in}$ and $v_{rel\_2}=v_{out2}-v_{in}$ wherein $v_{in}$ is the amplitude of the input signal from AC function generator (e.g., DDS) 210 which remains constant for both frequencies (e.g., $f_1$ and $f_2$). The logic flow 600 may then evaluate $v_{rel\_1}$ and $v_{rel\_2}$ for respective input frequencies $f_1$ and $f_2$ at block 622. When $v_{rel\_1}$ and $v_{rel\_2}$ are both zero (0), the OA 220 may act as a repeater because the ground fault equivalent impedance 231 is infinite ($\infty$). When the ground fault equivalent impedance 231 is infinite there is no leakage to ground, so no ground fault state is generated at block 623. When $v_{rel\_1}$ and $v_{rel\_2}$ are both non-zero, it is indicative of a ground fault. The ground fault may be characterized by evaluating a ratio between $v_{rel\_2}$ and $v_{rel\_1}$ when the AC function generator (e.g., DDS) 210 is ON at block 625. For example, $v_{rel\_2}$ and $v_{rel\_1}$ may be measurements of $(v_{out}-v_{in})$ for each of $v_{rel\_2}$ and $v_{rel\_1}$ and the ratio between $v_{rel\_2}$ and $v_{rel\_1}$ may be referred to as $\Delta v_{rel}$. $\Delta v_{rel}$ may be calculated according to $$\Delta v_{rel} = \frac{v_{rel\_2}}{v_{rel\_1}}.$$

If $\Delta v_{rel}$ is equal to one (1) when $v_{rel\_1}$ and $v_{rel\_2} \neq$ zero (0), then a pure resistive ground fault condition is determined at block 630. If $\Delta v_{rel}$ is greater than one (1) when $v_{rel\_1}$ and $v_{rel\_2} \neq$ zero (0), then a reactive ground fault condition is determined at block 635. It should be noted that if $\Delta v_{rel}$ is equal to two (2) when the input frequencies are in a 2:1 ratio as in this example, the reactive ground fault condition may be characterized as a pure reactive ground fault condition.

Fault Type Evaluation

As previously mentioned, there can be three types of ground fault conditions: an AC fault type, and two types of low impedance fault types—resistive or reactive. The circuit 200 of FIG. 2 may assist in detecting and identifying the type of the ground fault condition which can significantly aid in troubleshooting and fixing the problem causing the ground fault condition. As described above, the circuit 200 repetitively cycles taking measurements for $v_{out}$, evaluates $v_{rel\_1}$ and $v_{rel\_2}$ and recording the results. The results are then analyzed to determine what type of ground fault has occurred.

An AC fault may occur, for instance, if one of the AC wires from the main transformer secondary is shorted or is closely coupled with earth ground. The value of $v_{out}$ may detect this situation. For example, if AC function generator 210 is off, the positive input 215 of the OA 220 will be coupled to ground since it is not being driven by the AC function generator 210 and the OA output 227 will follow the AC level at the negative input 217 of OA 220. If considering, for example, the ground impedance $Z_G$ 232, the OA 220 output signal at 227 will be amplified according to the ratio of the ground impedance to the feedback resistance $(-R_{FB}/Z_G)$. In this case $Z_G$ 232 is the impedance of AC perturbation source. The OA 220 output signal at 227 may then be rectified by rectifier 240 and filtered by filter 250. A higher level AC negative input signal at 217 may saturate the OA 220 output at 227 and generate a fault. The OA 220 voltage output level at 227 will be set according to $(-R_{FB}/Z_G)^*v_{in}$ where $v_{in}$ is the perturbative input voltage and $Z_G$ 232 represents the internal resistance of perturbative source. Usually an AC fault will saturate the OA at output 227. In this example, if $v_{out}$ at 227 yields 0V when AC function generator 210 is off then no AC fault has occurred. This fault condition may be determined over a few measurement cycles.

A low impedance fault type may occur, for instance, if one of the available control panel inputs is touching or is coupled to earth ground. The values for $v_{rel\_1}$, and $v_{rel\_2}$ may provide information about earth ground impedance and the fault type (resistive or reactive). A reactive result may be characterized as a capacitive coupling issue.

An AC fault type is first excluded by performing the first step of the cycle (described above) and analyzing $v_{out}$ at 227. The circuit 200 then obtains values for $v_{rel\_1}$, and $v_{rel\_2}$ which may be interpreted as follows.

If $v_{out}$ represents the OA 220 output voltage at 227 and $v_{in}$ the carrier level at 215, then the dependency may be described as:

$$v_{out} = v_{in}\left(1 + \frac{R_{FB}}{Z_G}\right) \quad \text{(Eq. 1)}$$

if $v_{rel}=v_{out}-v_{in}$, then $$v_{rel} = v_{out} - v_{in} = v_{in} \cdot \frac{R_{FB}}{Z_G} \quad \text{(Eq. 2)}$$

if the ground impedance is modeled as an RC series circuit, the complex impedance becomes:

$$Z_{COMPLEX} = R + \frac{1}{j\omega c} = R - j\frac{1}{\omega c} \quad \text{(Eq. 3)}$$

where $Z_G$ 232 at a specific carrier frequency may be determined as:

$$Z_G = |Z_{COMPLEX}| = \sqrt{R^2 + \frac{1}{\omega^2 c^2}} \quad \text{(Eq. 4)}$$

The impedances that result for two different frequencies, $f_1$ and $f_2$ are:

$$Z_{G1} = \sqrt{R^2 + \frac{1}{(2\pi f_1)^2 c^2}} \quad \text{(Eq. 5)}$$

$$Z_{G2} = \sqrt{R^2 + \frac{1}{(2\pi f_2)^2 c^2}} \quad \text{(Eq. 6)}$$

setting $$f_2 = \frac{f_1}{2}$$

yields:

$$Z_{G1} = \sqrt{R^2 + \frac{1}{(2\pi f_1)^2 c^2}} \quad \text{(Eq. 7)}$$

$$Z_{G2} = \sqrt{R^2 + \frac{1}{(\pi f_1)^2 c^2}} \quad \text{(Eq. 8)}$$

In this case two possible extreme conditions may be considered. The first condition is indicative of a pure resistive fault in which $$\left(c = \infty \text{ or } \frac{1}{\omega^2 c^2} \to 0\right)$$

and $Z_{G1}=R$ and $Z_{G2}=R$ yielding:

$$v_{rel\_2} = v_{rel\_1} \quad \text{(Eq. 9)}$$

$$\Delta v_{rel} = \frac{v_{rel\_2}}{v_{rel\_1}} = 1 \quad \text{(Eq. 10)}$$

The second condition is indicative of a pure capacitive fault in which R=0 and $$Z_{G1} = \frac{1}{2\pi f_1 c},$$

$$Z_{G2} = \frac{1}{\pi f_1 c}$$

yielding:

$$\frac{1}{2\pi f_1 c} = \frac{v_i}{v_{rel\_1}} R_{FB} \quad \text{(Eq. 11)}$$

and $$\frac{1}{2\pi f_2 c} = \frac{1}{\pi f_1 c} = \frac{v_i}{v_{rel\_2}} R_{FB} \quad \text{(Eq. 12)}$$

$$v_{rel\_2} = 2 \cdot v_{rel\_1} \quad \text{(Eq. 13)}$$

yielding:

$$\Delta v_{rel} = \frac{v_{rel\_2}}{v_{rel\_1}} = 2 \quad \text{(Eq. 14)}$$

For two different frequencies with a defined ratio of 2:1 (e.g., $f_1$ and ½ $f_1$), $\Delta v_{rel}$ will swing from 1 to 2 depending on the ground fault type. Thus, by evaluating $\Delta v_{rel}$ ($v_{rel\_2}/v_{rel\_1}$) it can be decided whether a ground fault condition exists and if so characterize the type of that ground fault condition.

While the present invention has been disclosed with reference to certain embodiments, numerous modifications, alterations and changes to the described embodiments are possible without departing from the sphere and scope of the present disclosure, as defined in the appended claims. Accordingly, it is intended that the present invention not be limited to the described embodiments, but that it has the full scope defined by the language of the following claims, and equivalents thereof.

What is claimed is:

1. A method of determining a type of ground fault condition in a circuit comprising:
    applying a first and a second AC input signal having a first and a second frequency ($f_1$ and $f_2$) and a constant voltage level to a positive input of an operational amplifier (OA) to obtain a first and a second AC output signal, wherein the first and the second AC input signals are produced by an AC function generator;
    applying a first and a second feedback signal to a negative input of the OA, the first and second feedback signals derived from the first and second AC output signals coupled to a ground path impedance;
    rectifying the first and the second AC output signals to obtain first and second DC signals;
    filtering the rectified first and second DC signals to obtain first and second steady DC voltages;
    measuring, using a CPU of a control panel of a security system, the first and second steady DC voltages;
    determining, using the CPU, a first and a second relative voltage by subtracting the constant voltage level from the first and second steady DC voltages;
    determining, using the CPU, a ratio of the second relative voltage to the first relative voltage; and
    characterizing, using the CPU, a type of ground fault according to the ratio.

2. The method of claim 1, the ground path impedance comprising a feedback resistance ($R_{FB}$) coupled with a ground impedance ($Z_G$).

3. The method of claim 1, wherein characterizing the type of ground fault according to the ratio further comprises characterizing the ground fault as a pure resistive fault when the ratio of the second relative voltage to the first relative voltage is 1.

4. The method of claim 1, wherein characterizing the type of ground fault according to the ratio further comprises characterizing the ground fault as a reactive fault when the ratio of the second relative voltage to the first relative voltage is greater than 1 and less than a quotient of the first frequency ($f_1$) and the second frequency ($f_2$).

5. The method of claim 1, wherein characterizing the type of ground fault according to the ratio further comprises characterizing the ground fault as a pure reactive fault when the ratio is equal to a quotient of the first frequency ($f_1$) and the second frequency ($f_2$).

6. The method of claim 1, further comprising:
    measuring a voltage amplitude level of the output of the OA when no input signal is applied to the positive input of the OA; and
    determining there is an AC ground fault when there is a non-zero voltage amplitude level at the output of the OA.

7. The method of claim 1, further comprising creating an alert notification to notify of the existence of the ground fault condition, the alert notification sent to one of a control panel, a keypad, and a remote monitoring location.

8. The method of claim 7, the alert notification comprising a sound emitted in a particular pattern to indicate the type of ground fault condition.

9. The method of claim 7, the alert notification comprising a light blinking in a particular pattern to indicate the type of ground fault condition.

10. A ground fault detection circuit comprising:
an AC function generator configured to generate at least two separate AC input signals having a constant voltage level and different frequencies, $f_1$ and $f_2$;
an operational amplifier (OA) having positive and negative inputs and an output, the OA configured to receive the AC input signals at the positive input and provide an AC output signal;
an OA feedback loop in which a ground is coupled at the negative input of the OA with the AC output signal that is coupled to the negative input of the OA through a feedback resistor;
a rectifier configured to receive the AC output signal and convert it to a DC signal; and
a filter configured to receive the rectified DC signal and output a steady DC voltage;
wherein
a first steady DC voltage ($v_{out1}$) is recorded by a CPU of a control panel of a security system when the first AC input signal is applied to the OA positive input;
a first relative voltage is determined by the CPU by subtracting the constant voltage level from the first steady DC voltage;
a second steady DC voltage ($v_{out2}$) is recorded by the CPU when the second AC input signal is applied to the OA positive input;
a second relative voltage is determined by the CPU by subtracting the constant voltage level from the second steady DC voltage;
a ratio between second relative voltage and first relative voltage ($v_{rel\_2}/v_{rel\_1}$) is determined by the CPU; and
a ground fault type is determined by the CPU based on the ratio.

11. The ground fault detection circuit of claim 10, the AC function generator comprising a direct digital synthesis (DDS) sine wave generator.

12. The ground fault detection circuit of claim 10, wherein the ground fault type is characterized as pure resistive when the ratio between second relative voltage and first relative voltage is 1.

13. The ground fault detection circuit of claim 10, wherein the ground fault type is characterized as reactive when the ratio between second relative voltage and first relative voltage is greater than 1 and less than a quotient of the frequencies $f_1$ and $f_2$.

14. The ground fault detection circuit of claim 10, wherein the ground fault type is characterized as pure reactive when the ratio between second relative voltage and first relative voltage is equal to a quotient of the frequencies $f_1$ and $f_2$.

15. The ground fault detection circuit of claim 10, wherein an AC ground fault is determined when a non-zero gain at the output of the OA is detected when no input signal is applied to the OA positive input.

16. The ground fault detection circuit of claim 15, further comprising creating an alert notification to notify of the existence of the ground fault condition, the alert notification sent to one of a control panel, a keypad, and a remote monitoring location associated with a security system.

17. The ground fault detection circuit of claim 10, further comprising creating an alert notification to notify of the existence of the ground fault condition, the alert notification sent to one of a control panel, a keypad, and a remote monitoring location associated with a security system.

* * * * *